United States Patent
Ustamujic et al.

(10) Patent No.: US 10,934,027 B2
(45) Date of Patent: Mar. 2, 2021

(54) ENERGY SUPPLYING DEVICE FOR SPACECRAFT

(71) Applicant: Airbus Defence and Space GmbH, Taufkirchen (DE)

(72) Inventors: Faris Ustamujic, Otttobrunn (DE); Jens Birkel, Otttobrunn (DE); Ramon Arroyo De La Fuente, Munich (DE); Andreas Uebner, Ottobrunn (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 325 days.

(21) Appl. No.: 15/958,849

(22) Filed: Apr. 20, 2018

(65) Prior Publication Data
US 2018/0346156 A1    Dec. 6, 2018

(30) Foreign Application Priority Data
Jun. 6, 2017 (EP) ..................... 17174551

(51) Int. Cl.
*B64G 1/42* (2006.01)
*B64G 1/44* (2006.01)
(Continued)

(52) U.S. Cl.
CPC .............. *B64G 1/443* (2013.01); *B64G 1/10* (2013.01); *B64G 1/1078* (2013.01); *B64G 1/428* (2013.01);
(Continued)

(58) Field of Classification Search
CPC ................................. B64G 1/44; B64G 1/443
See application file for complete search history.

(56) References Cited

U.S. PATENT DOCUMENTS

| | | | |
|---|---|---|---|
| 5,961,738 A * | 10/1999 | Benton .................... | B64G 1/44 136/245 |
| 2002/0066828 A1* | 6/2002 | Nakamura ............. | B64G 1/443 244/172.7 |

(Continued)

FOREIGN PATENT DOCUMENTS

| | | |
|---|---|---|
| DE | 102012000260 B3 | 1/2013 |
| EP | 1160876 A2 | 12/2001 |

OTHER PUBLICATIONS

European Search Report for Application No. 17174551 dated Nov. 21, 2017.

*Primary Examiner* — Richard G Davis
(74) *Attorney, Agent, or Firm* — Jenkins, Wilson, Taylor & Hunt, P.A.

(57) ABSTRACT

A method for coupling an energy supplying device to an energy consuming device in space and to a system including an energy supplying device, an energy consuming device and a mobile assembly unit residing in space. The energy supplying device is operable in space and includes solar panel units to convert received light into electrical energy, first coupling members to couple the solar panel units with each other, and a second coupling member to electrically couple the energy supplying device with the energy consuming device. The energy supplying device is configured to supply electrical energy to the energy consuming device in space. A configuration of the solar panel units is changeable in space according to an operational requirement of the energy consuming device.

12 Claims, 2 Drawing Sheets

(51) Int. Cl.
*H01L 31/042* (2014.01)
*B64G 1/10* (2006.01)

(52) U.S. Cl.
CPC .............. *B64G 1/44* (2013.01); *H01L 31/042* (2013.01); *B64G 2001/1092* (2013.01)

(56) References Cited

U.S. PATENT DOCUMENTS

| | | |
|---|---|---|
| 2007/0029446 A1 | 2/2007 | Mosher et al. |
| 2007/0228219 A1 | 10/2007 | Behrens et al. |
| 2009/0315412 A1 | 12/2009 | Yamamoto et al. |
| 2013/0176049 A1 | 7/2013 | Bauer et al. |

* cited by examiner

ENERGY SUPPLYING DEVICE FOR SPACECRAFT

CROSS-REFERENCE TO RELATED APPLICATION

This application claims priority to European Patent Application EP 17 174 551.6 filed Jun. 6, 2017, the entire disclosure of which is incorporated by reference herein.

TECHNICAL FIELD

The present disclosure generally relates to an energy supplying device for a spacecraft and a system comprising the energy supplying device. The system further includes a mobile assembly unit configured to automatically assemble the energy supplying device in space.

BACKGROUND

In current aerospace applications, spacecrafts like satellites for e.g. telecommunication applications are equipped with energy supplying devices prior to launch. That is, before a satellite is launched from earth into space, the satellite as an energy consuming device must be provided with an energy supplying device to guarantee proper functioning of various systems onboard the satellite. For this purpose, solar arrays in the form of foldable wings are normally used. Since a satellite is launched into space within a launcher system such as a rocket or a capsule, a solar array serving as the energy supplying device is conventionally fixedly attached to the satellite prior to launch and eventually launched together with the satellite in the launcher system.

This leads to certain space restrictions within the launcher system, since the solar array has to fit between the satellite and payload fairing. Further, different satellite missions and different satellite payloads result in different satellite design and different power needs. However, increase in power needs generally comes along with increasing dimensions of the solar array, even in a folded state. As a result, available space within a launcher system is even scarcer for large satellites with high power needs.

Accordingly, it is particularly challenging for outboard components of the satellite, i.e. for the mentioned solar array as well as for antennas and propulsion devices to fit into the available space within the respective launcher system. Solar array hold-down systems for ensuring that the solar array is able to sustain launch loads, especially when in a folded condition, constitute further space consuming components. Hence, complex stowing solutions are required that are the outcome of time consuming yet expensive tailoring processes to achieve the best possible exploitation of space within the launcher system. As a result, options for satellite design as well as for solar array design in such tailoring processes are limited to the available space in the launcher system. Further, different types and combinations of spacecrafts/satellites demand for separate tailoring processes, rendering these tailoring processes even more elaborate.

In addition, the described tailoring processes take place prior to launch of the satellite within the launcher system. This makes it impossible to react to changes in power needs of the satellite due to e.g. mission change after launch.

The above described drawbacks result in the need for a modular and scalable standalone system with an energy supplying device for supplying electrical energy to a satellite, the energy supplying device being automatically assembled in space and subsequently automatically coupled to the satellite. This makes it possible to deploy energy supplying devices and satellites independently from each other, thereby rendering the consideration of the energy supplying device in the tailoring process obsolete. As a result, it is possible for a satellite to take up the whole space available in a launcher system, finally allowing for enhanced design options for satellites and other energy consuming devices. Further, modularity of the energy supplying device allows for changes in configuration of the energy supplying device under consideration of actual power needs of the satellite.

SUMMARY

According to a first aspect, there is provided an energy supplying device for supplying energy to an energy consuming device. The energy supplying device is operable in space and comprises a plurality of solar panel units configured to convert received light into electrical energy and a plurality of first coupling members configured to couple the plurality of solar panel units with each other. The energy supplying device further comprises a second coupling member configured to electrically couple the energy supplying device with the energy consuming device. The energy supplying device is configured to supply electrical energy to the energy consuming device in space. A configuration of the plurality of solar panel units is changeable in space according to an operational requirement of the energy consuming device.

The change of configuration of the plurality of solar panel units may be carried out in space without manned support, i.e. without the help of astronauts. The same may apply to the electrical coupling of the energy supplying device with the energy consuming device.

The energy consuming device may be a satellite or every other spacecraft or component of such a spacecraft that needs to be supplied with electrical energy for guaranteeing proper functioning of its onboard systems.

The number of the plurality of solar panel units of the energy supplying device is not limited and may preferably depend on the electrical characteristics (such as e.g. nominal output power) of a single solar panel unit and/or an estimated power consumption (power needs) of the energy consuming device.

The configuration of the plurality of solar panel units may be changeable by at least one of adding an additional solar panel unit to the plurality of solar panel units, removing a solar panel unit from the plurality of solar panel units, and replacing a solar panel unit in the plurality of solar panel units.

For this purpose, the energy supplying device may be configured to determine a malfunctioning solar panel unit among the plurality of solar panel units. The malfunctioning solar panel unit may be replaced by a replacement solar panel unit. In this way, it is possible to renew one or more damaged solar panel units in the energy supplying device.

Alternatively or additionally, the energy supplying device may be configured to determine the operational requirement as a reduction in estimated power consumption of the energy consuming device. The solar panel unit may be removed from the plurality of solar panel units according to the reduction in estimated power consumption. In this way, it is possible to react to decreasing power needs of the energy consuming device for future mission. The removed solar panel unit may be reusable in connection with another energy consuming device residing in space or to be launched into space in the future.

Alternatively or additionally, the energy supplying device may be configured to determine the operational requirement as an increase in estimated power consumption of the energy consuming device. The additional solar panel unit may be added to the plurality of solar panel units according to the increase in estimated power consumption. In this way, it may be possible to react to increasing power needs of the energy consuming device for future mission.

The estimated power consumption may be calculated by the power supplying device based on a past reference value for power consumption of the energy consuming device. Alternatively or additionally, the power supplying device may receive a signal that indicates the estimated power consumption and the power supplying device determines the estimated power consumption from the received signal.

The plurality of solar panel units may have identical configurations with respect to at least one of power rating, size and internal wiring. Alternatively, the plurality of solar panel units may have different configurations with respect to at least one of power rating, size and internal wiring. For example, the plurality of solar panel units may comprise different numbers of power lines. The number of power lines in the respective solar panel units may be a number between 1 and 10, but is not limited thereto.

The second coupling member may be configured to wirelessly couple the energy supplying device with the energy consuming device. Accordingly, the energy supplying device may be configured to wirelessly supply electrical energy to the energy consuming device.

Alternatively, the second coupling member may be configured to couple the energy supplying device with the energy consuming device in a wired manner. In such case, the second coupling member may further be configured to mechanically couple the energy supplying device with the energy consuming device.

The second coupling member may comprise a dedicated coupling unit. The dedicated coupling unit may be configured to transfer mechanical loads arising during on-orbit operation of the energy supplying device and to transfer electrical energy from the energy supplying device to the energy consuming device.

According to a second aspect, there is provided a system comprising the plurality of solar panel units according to the first aspect. The system further comprises an energy consuming device being operable in space, and a mobile assembly unit residing in space and being configured to automatically assemble the energy supplying device in space from the plurality of solar panel units by coupling the plurality of solar panel units with each other via the plurality of first coupling members, to electrically couple the energy supplying device to the energy consuming device via the second coupling member and to change the configuration of the plurality of solar panel units according to the operational requirement of the energy consuming device.

The mobile assembly unit may further be configured to transport the plurality of solar panel units or the assembled energy supplying device into the vicinity of the energy consuming device.

The system may further comprise a spacecraft for launching the plurality of solar panel units into space. The spacecraft may serve as an in-space repository for the plurality of solar panel units after launch. Since launch is a main cost driver in aerospace applications in general, the plurality of solar panel units may be launched together with further solar panel units to fully utilize available space in the spacecraft.

According to a third aspect, there is provided a method for supplying energy from an energy supplying device to an energy consuming device. The energy supplying device is operable in space and comprises a plurality of solar panel units configured to convert received light into electrical energy. The method comprises coupling the plurality of solar panel units with each other via a plurality of first coupling members, electrically coupling the energy supplying device with the energy consuming device in space via a second coupling member, supplying electrical energy from the energy supplying device to the energy consuming device and changing a configuration of the plurality of solar panel units in space according to an operational requirement of the energy consuming device.

BRIEF DESCRIPTION OF THE DRAWINGS

Further aspects, advantages and details of the disclosure herein are derivable from the following description of embodiments in conjunction with the example drawings, in which.

DETAILED DESCRIPTION

Figure 1:
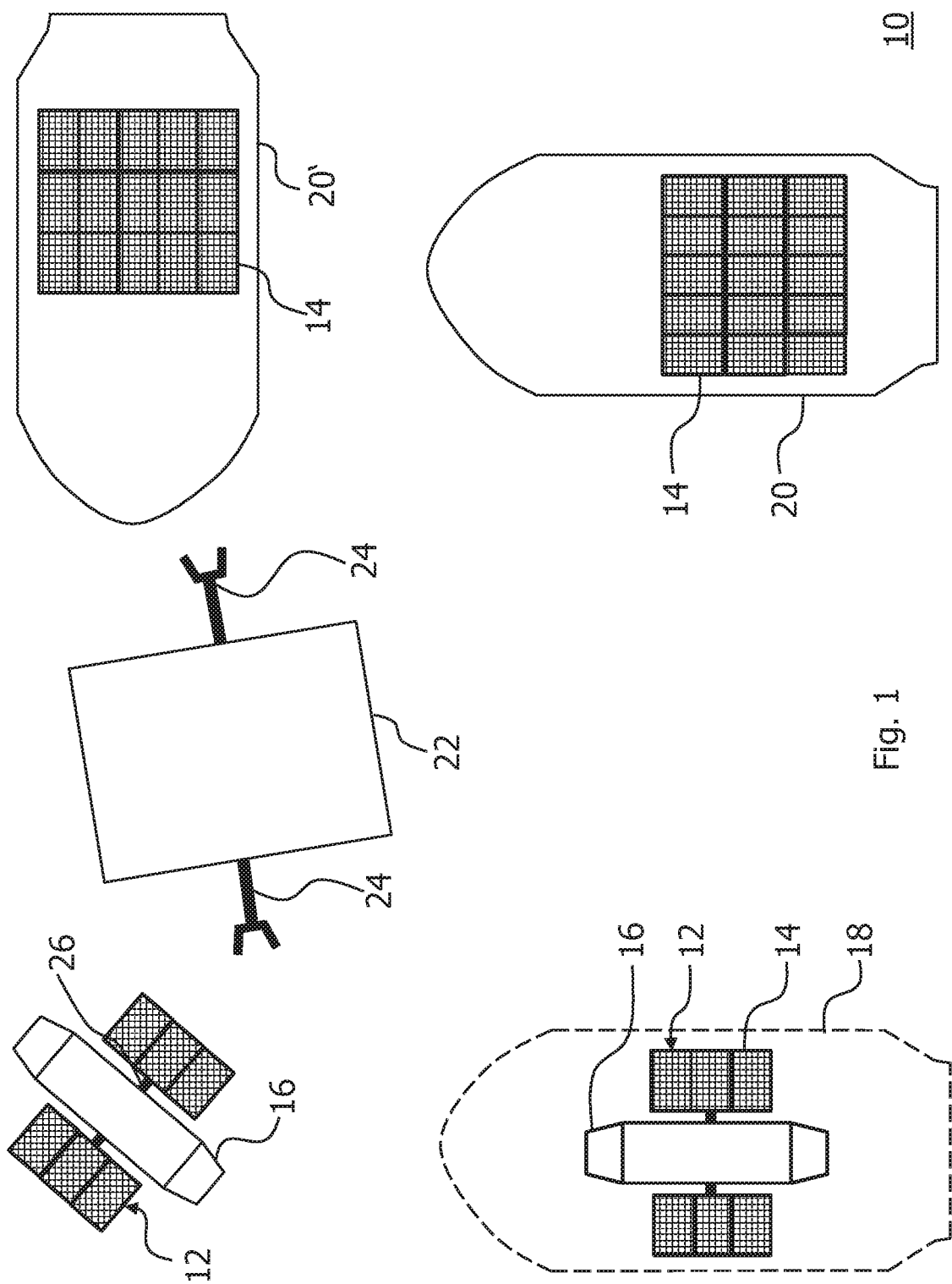
FIG. 1 schematically illustrates an energy supplying device, an energy consuming device, a mobile assembly unit and a repository for solar panel units according to an embodiment.

FIG. 1 schematically illustrates an example of a system 10. Components included in system 10 are at least an energy supplying device 12, a plurality of solar panel units 14 comprised in the energy supplying device 12, an energy consuming device in form of, but not limited to, a satellite 16 being supplied with energy by the energy supplying device 12 and a mobile assembly unit 22. The satellite 16 and the energy supplying device 12 may be arranged within a launcher system in form of a rocket 18 prior to being launched into space. Rocket 18 constitutes an optional part of system 10.

Figure 2:
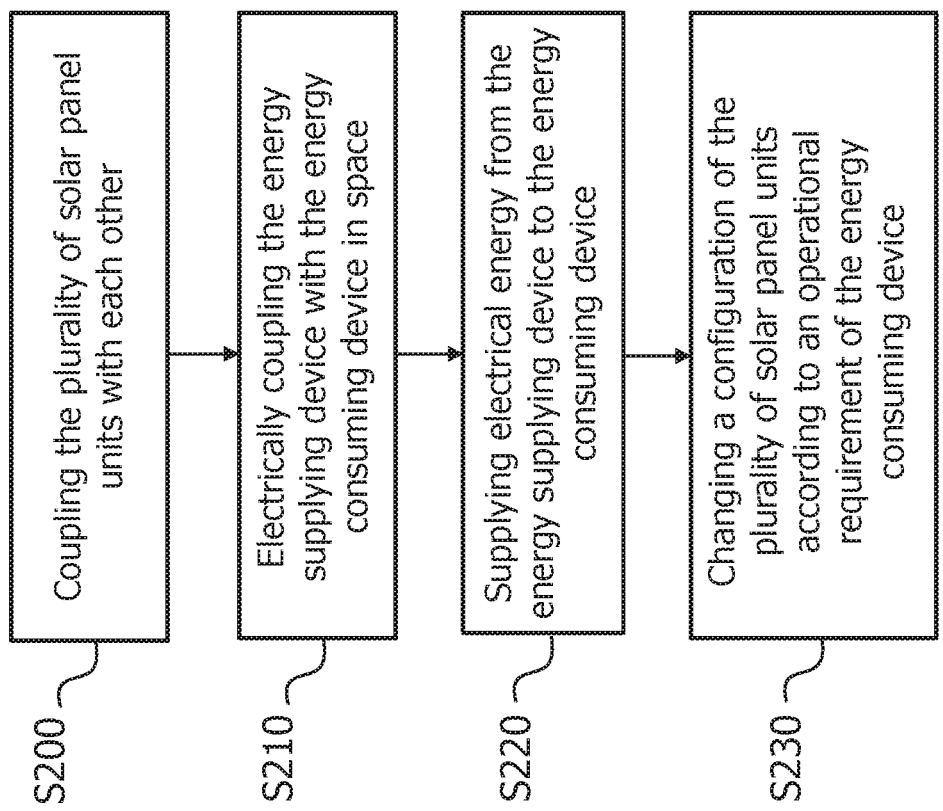
FIG. 2 illustrates a flowchart according to an embodiment of a method for supplying energy from an energy supplying device being operable in space to an energy consuming device.

FIG. 2 schematically illustrates a flowchart of a method which may be performed by one or more of the components of system 10. Thus, further details regarding the operation of system 10 and its respective components will be described in the following with reference to both FIGS. 1 and 2.

As shown in the lower left corner of FIG. 1, the energy supplying device 12 may be pre-assembled from the plurality of solar panel units 14 on ground and coupled to satellite 16 prior to launch. In the example of FIG. 1, the energy supplying device 12 includes a total of six solar panel units 14. However, the number of solar panel units 14 is just exemplary and is not limited to six. Rather, the number of solar panel units 14 may depend on the dimensions and/or the performance characteristics of a single solar panel unit 14 and the estimated nominal power consumption (i.e. the power needs) of satellite 16.

Alternatively, it is conceivable that no solar panel units 14 are coupled to the satellite 16 prior to launch, but coupled to satellite 16 in space instead. In this way, it is possible to preserve more space for the satellite 16 itself within rocket 18. Satellite 16 may comprise a battery system with stored energy sufficient to allow on-orbit operation until energy supplying device 12 supplies electrical energy to satellite 16. Alternatively or additionally, satellite 16 may comprise a photovoltaic assembly (not shown in FIG. 1) fixedly mounted to one or more of its side walls. The photovoltaic assembly may comprise solar cells made from silicon and is configured to convert received light into electrical energy sufficient to allow on-orbit operation of satellite 16 until energy supplying device 12 supplies electrical energy to satellite 16.

The plurality of solar panel units 14 may have different or identical configurations with respect to power rating and/or size and/or internal wiring. That is, each of the plurality of solar panel units 14 may have a configuration that is different from a configuration of another one of the solar panel units 14. Alternatively, a certain number of the plurality of solar panel units 14 may have identical configurations, whereas the rest of the plurality of solar panel units 14 may have different configurations with respect to the certain number of solar panel units 14. Accordingly, the plurality of solar panel units 14 may have different or identical nominal output power and a different or identical number of power lines. At least some of these power lines may be power lines configured to guide power generated in a first solar panel unit of the plurality of solar panel units 14 through a second solar panel unit of the plurality of solar panel units 14.

For the following description, it is assumed that (contrary to the example in FIG. 1), no energy supplying device 12 is coupled to satellite 16 prior to the satellite's 16 launch.

The method shown in the flowchart of FIG. 2 is directed to the supplying of energy from the energy supplying device 12 to the satellite 16 after the satellite 16 has been launched into space, i.e. when the satellite 16 has finally reached its designated orbit, as it is schematically illustrated in the upper left corner of FIG. 1.

As shown in FIG. 2, in step S200, a specific number of the plurality of solar panel units 14 are coupled with each other via a plurality of coupling members (not shown in FIG. 1). The plurality of coupling members may include plugs, cables and mechanical connectors. Although the present disclosure is not limited thereto, each of the plurality of coupling members may be an integral part of a respective solar panel unit of the plurality of solar panel units 14.

A launcher system 20 in the form of a rocket or any other suited spacecraft is stowed with the plurality of solar panel units 14 prior to launch to carry the plurality of solar panel units 14 into space. At this time, the satellite 16 may or may not have already been launched into space via rocket 18. That is, launcher system 20 may be launched into space at a different time and/or from a different place with respect to rocket 18.

The number of solar panel units 14 stowed into launcher system 20 is not limited. Preferably, the launcher system 20 carries as much solar panel units as possible so that storage space within the launcher system 20 is fully utilized. As mentioned previously, it is further conceivable that one or more energy supplying devices 12 are pre-assembled (but not coupled to satellite 16) from the plurality of solar panel units 14 prior to launch of launcher system 20. In such case, it is possible that launcher system 20 carries the plurality of solar panel units 14 and/or a plurality of pre-assembled energy supplying devices 12 into space. The pre-assembled energy supplying devices 12 may have different ratings with respect to their respective nominal output power. Once launched into space, the launcher system 20 may remain in its designated orbit and may serve as a repository, i.e. as a storage space 20' for the plurality of solar panel units 14.

In case the energy supplying device is not pre-assembled before launch, coupling of the solar panel units is carried out by mobile assembly unit 22 utilizing the specific number of the plurality of solar panel units 14 stowed in storage space 20'. The specific number of the plurality of solar panel units 14 may be determined based on estimated power consumption of satellite 16. The mobile assembly unit 22 is configured to operate autonomously and continuously in space, i.e. without the need of manned support. The mobile assembly unit 22 includes at least one assembly 24. The assembly 24 may include one or more manipulator systems such as a robot arm, a robot gripper or the like for e.g. gripping certain assembly tools and/or the plurality of solar panel units 14. Further, the mobile assembly unit 22 includes communication ability and structure for communicating with one or more of the other components of system 10 such as e.g. satellite 16 and storage space 20'.

The mobile assembly unit 22 is configured to navigate to and to dock at storage space 20' and to select and/or gather the specific number of the plurality of solar panel units 14. The same applies for the pre-assembled energy supplying devices 12 in storage space 20'.

The mobile assembly unit 22 may include a chemical drive system and/or an electrical drive system. In either way, the mobile assembly unit 22 is configured to refuel autonomously at storage space 20'. Therefore, the storage space 20' may include tanks or other repository to store chemical fuel and/or gas needed for the production of ions in the electrical drive system of the mobile assembly unit 22.

The mobile assembly unit 22 may automatically assemble energy supplying device 12 at or at least nearby storage space 20'. Therefore, the mobile assembly unit 22 couples, by utilizing the assembly 24, the specific number of the plurality of solar panel units 14 with each other utilizing the plurality of coupling members. During the automatic assembly of energy supplying device 12, a coupling member 26 for electrically and/or mechanically coupling the energy supplying device 12 to satellite 16 at a later stage may at least be partly mounted to the energy supplying device 12.

After assembly of the energy supplying device 12 is completed, the energy supplying device is quality checked by the mobile assembly unit 22. Such quality check may also be applied to one or more pre-assembled energy supplying devices 12 selected from storage space 20'. Therefore, mechanical as well as electrical connections established during assembly are tested regarding their proper functioning by utilizing a suitable checking device for the mobile assembly unit 22.

The checking device may alternatively or additionally be comprised in storage space 20'. The checking device(s) may include a dedicated measurement device that is configured to measure quantities like e.g. the nominal output power of the energy supplying device 12 (and of its respective solar panel units 14). Further, the checking device(s) are suited to check overall functionality of energy supplying device 12 as well as functionality of each of the plurality of solar panel units 14 included in energy supplying device 12. This particularly serves to ensure that no malfunctioning solar panel unit (that may has suffered from damage during launch) is used for energy supplying device 12.

The checking device may further include a mechanical coupling adaptor to check mechanical coupling integrity of the first coupling members. Therefore, each of the plurality of solar panel units 14 used for assembly of the energy supplying device 12 is individually connected and disconnected to the mechanical coupling adaptor one by one. This is preferably carried out prior to automatic assembly of the energy supplying device 12.

Once automatic assembly and quality check of the energy supplying device 12 is finished at or nearby storage space 20', the energy supplying device 12 is transported by the mobile assembly unit 22 into the vicinity of satellite 16. The same applies for the one or more pre-assembled energy supplying devices 12. For this purpose, the mobile assembly unit 22 is configured to navigate to and to dock at satellite 16. For navigation, the mobile assembly unit 22 may be equipped with orientation and navigation device(s) such as an Attitude and Orbit Control System (AOCS). The AOCS of the mobile assembly unit 22 may comprise but is not limited to one or more sun sensors and/or star trackers, one or more processing units for position control, one or more actuators like thrusters and/or reaction wheels. The AOCS of the mobile assembly unit 22 may further comprise an on-board navigation system and/or a GPS receiver. During transport, the orientation and/or navigation device(s) preferably ensure that the mobile assembly unit 22 does not cross Van Allen radiation belt or any other altitudes with high radiation, since this would result in cell degradation of individual solar cells comprised in the plurality of solar panel units 14. For similar reasons, storage space 20' is preferably positioned outside Van Allen radiation belt.

As an alternative, the specific number of the plurality of solar panel units 14 needed for energy supplying device 12 may be transported into the vicinity of satellite 16 prior to the automatic assembly of the energy supplying device 12. In such case, the mobile assembly unit 22 automatically assembles the energy supplying device 12 at or at least nearby satellite 16, but still in the above described manner.

To avoid damages to the plurality of solar panel units 14 and/or the one or more pre-assembled energy supplying devices 12 during transport, the plurality of solar panel units 14 and/or the one or more pre-assembled energy supplying devices 12 may be equipped with suitable hold-down devices. These hold-down devices may also be used for sustaining loads during launch of the plurality of solar panel units 14 and/or the pre-assembled energy supplying devices 12 within launcher system 20.

As an alternative, the plurality of solar panel units 14 may be stacked by flexible distance elements like e.g. snubbers and subsequently transported within a frame work container included in the mobile assembly unit 22. In such case, the above described quality check for the plurality of solar panel units 14 may be carried out inside the frame work container during transport.

Satellite 16 comprises various onboard systems including the above mentioned battery system with one or more energy storage devices such as a rechargeable battery pack as well as communication for communicating with one or more of the other components of system 10.

In order to guarantee proper functioning of the onboard systems of the satellite 16, energy supplying device 12 (being either pre-assembled before launch or automatically assembled by the mobile assembly unit 22 at storage space 20' or at satellite 16) of system 10 is configured to supply electrical energy to the satellite 16. Therefore, in step S210 (see FIG. 2), the energy supplying device 12 is electrically coupled with satellite 16 via coupling member 26 (see FIG. 1) by the mobile assembly unit 22.

It is further conceivable that the satellite 16 comprises pre-installed coupling or at least parts thereof for electrically and/or mechanically coupling the energy supplying device thereto.

The electrical coupling between the energy supplying device 12 and the satellite 16 may be realized in a wireless manner. In this case, the energy supplying device 12 is not mechanically coupled to the satellite 16. This enables independent operation of the energy supplying device 12 with respect to satellite 16, i.e. the energy supplying device 12 may operate as an independent (artificial) moon of the satellite 16. Such independent operation of the energy supplying device 12 renders mechanical connections (as part of the coupling member 26) and plugging maneuvers between energy supplying device 12 and satellite 16 obsolete. However, in such case, the energy supplying device 12 is equipped with communication capability for communicating with other components of system 10 including satellite 16. Further, the energy supplying device 12 is equipped with orientation and navigation capabilities such as an AOCS in such case.

As an alternative, the electrical coupling between the energy supplying device 12 and the satellite 16 may be realized in a wired manner, e.g. by a specific cable. The cable may include cables that remain flexible in cold environments, bare high loads and strains prior to failure and that are resistant to radiation. In such a case, the independent operation of the energy supplying device 12 with respect to satellite 16 is still preserved, since no additional mechanical connection besides the cable is applied between the energy supplying device 12 and the satellite 16.

According to another alternative, a mechanical coupling mechanism between the energy supplying device 12 and the satellite 16 is provided to removably mount the energy supplying device 12 to the satellite 16. For such mechanical coupling mechanism, coupling member 26 includes a dedicated plug-in system for electrically and mechanically connecting the energy supplying device 12 to the satellite 16. Such dedicated plug-in system is configured to transfer mechanical loads that act during on-orbit operation of energy supplying device 12 and to transfer electrical energy from the energy supplying device to satellite 16 so that satellite 16 is supplied with power. The mechanical loads may result from orbital positioning maneuvers of satellite 16 via thruster comprised in satellite 16.

The dedicated plug-in system includes at least one mechanical interface and at least one electrical interface for mechanically and electrically connecting the energy supplying device 12 with satellite 16, respectively. The at least one mechanical interface and the at least one electrical interface may include a screwed interface and/or a plugged interface. The at least one mechanical interface and the at least one electrical interface may be comprised in a common interface. Alternatively, the at least one mechanical interface and the at least one electrical interface may constitute different (i.e. separate) interfaces. In the latter case, to ensure proper coupling between energy supplying device 12 and satellite 16, the electrical and mechanical coupling between energy supplying device 12 and satellite 16 via the electrical and mechanical interfaces is established simultaneously or at least within a short period of time.

Coupling member 26 and/or the dedicated plug-in system may include a Solar Array Drive Mechanism (SADM) that allows for rotation of the energy supplying device 12 around at least one axis while power is supplied to satellite 16. Alternatively, the SADM may be an integral part of satellite 16. In such case, the mechanical and electrical interfaces of the dedicated plug-in system are configured to be coupled to the SADM of satellite 16 in space, i.e. while satellite 16 resides in its designated orbit.

The principle (or at least parts thereof) of the dedicated plug-in system described above may further be applied to one or more of the plurality of coupling members for coupling the plurality of solar panel units 14 with each other. However, in such case, the above described components and/or interfaces are then provided in a smaller size.

When the electrical coupling between the energy supplying device 12 and the satellite 16 is established, the energy supplying device 12 in step S220 supplies electrical energy to the satellite 16. In case the coupling is established in a wireless manner, this may be realized via inductive power transmission, radio wave transmission such as e.g. power transfer by laser or any other suitable mechanism for power transmission. In case of power transfer by laser, laser terminals are included in energy supplying device 12 and in satellite 16.

The energy supplying device 12 and/or other components of system 10 such as e.g. satellite 16 may further be configured to recognize changes in required power consumption of the satellite 16. That is, the energy supplying device 12 may recognize if the satellite 16 is expected to consume—for example as compared to a past reference period—more or less power in the future, e.g. due to possible mission changes. Recognizing changes in required power consumption may be based on calculations utilizing a value for power consumption during the past reference period and/or receiving a signal indicating such change in required power consumption from one or more components of system 10 such as satellite 16 or from mission control center.

Further, energy supplying device 12 may be configured to recognize whether one or more of the plurality of solar panel units 14 of the energy supplying device 12 is malfunctioning, has a reduced output power compared to its nominal output power due to e.g. cell degradation in the respective solar panel unit, or is even inoperable at all. Alternatively, such a malfunctioning state may be recognized by the respective solar panel unit 14 itself and be communicated, via suitable communication device(s) of the solar panel unit 14, to the energy supplying device 12 and/or to the satellite 16.

In each of the scenarios described above, the energy supplying device 12 and/or other components of system 10 such as satellite 16 may request the mobile assembly unit 22 to add or remove or replace one or more of the solar panel units 14. Alternatively or additionally, such requests may come from mission control center.

For example, if the energy supplying device 12 determines that required power consumption of the satellite 16 is likely to rise in the future (e.g. due to mission change), it may request the mobile assembly unit 22 to mount one or more additional solar panel units 14 to the energy supplying device 12. The number of the additional solar panel units 14 thereby depends, amongst other factors, on the nominal output power of one solar panel unit and the amount of additional power that is required by the satellite 16 in the future. Upon request, the mobile assembly unit 22 navigates to and docks at storage space 20' and gathers the necessary solar panel units 14 therefrom. Then, the mobile assembly unit 22 automatically couples these (additional) solar panel units 14 to assemble an additional energy supplying device utilizing the assembly 24. This assembly is carried out analogously to the automatic assembly of energy supplying device 12 described above. The additional energy supplying device is then transported by the mobile assembly unit 22 to energy supplying device 12 (i.e. to satellite 16 to which energy supplying device 12 is coupled) and automatically mounted and electrically coupled thereto. Alternatively, the additional solar panel units are transported by the mobile assembly unit 22 into the vicinity energy supplying device 12 and are subsequently coupled with each other thereat to assemble the additional energy supplying device.

On the other hand, if the energy supplying device 12 determines that required power consumption of the satellite 16 is likely to decrease in the future, it may request the mobile assembly unit 22 to remove one or more of the solar panel units 14 from energy supplying device 12. In this case, the mobile assembly unit 22 navigates to and docks at satellite 16 (to which energy supplying device 12 is coupled) and automatically removes (i.e. decouples) one or more of the solar panel units 14 from energy supplying device 12. If more than one solar panel units 14 are removed, the mobile assembly unit 22 may further decouple the removed solar panel units from each other at satellite 16. The number of the solar panel units 14 to be removed depends, amongst other factors, on the nominal output power of one solar panel unit 14 and the decreased amount of power that is required by the satellite 16 in the future. The removed solar panel units 14 may be transported by the mobile assembly unit 22 to storage space 20'. If not already done prior to transport, the removed solar panel units may be automatically decoupled from each other and thereby disassembled into the respective solar panel units 14 via the assembly 24 of the mobile assembly unit 22 at storage space 20'. Then, the solar panel units 14 may be stowed in storage space 20', e.g. for further use.

If the energy supplying device 12 determines that one or more of the solar panel units 14 of energy supplying device 12 are inoperable or suffer from degradation of nominal power output and thus need to be replaced, it may request the mobile assembly unit 22 to do so. In this case, the mobile assembly unit 22 first navigates to and docks at storage space 20', gathers therefrom the required number of solar panel units 14 to be replaced, automatically assembles (if more than one solar panel units 14 are required) an replacing energy supplying device from the plurality of solar panel units 14 and transports the replacing energy supplying device to satellite 16. At satellite 16, the mobile assembly unit 22 replaces the inoperable solar panel units 14 with the replacing energy supplying device. The removal of the inoperable solar panel units 14 and the coupling of the replacing energy supplying device is carried out analogously to the cases describe above where nominal output power of the energy supplying device 12 shall be decreased/increased.

In the above described scenario, it is also conceivable that—instead of replacing one or more inoperable solar panel units in the energy supplying device 12—the energy supplying device 12 (including one or more solar panel units 14 that are still functioning) is replaced as a whole.

After removal, the inoperable solar panel units 14 (or the solar panel units from the removed energy supplying device 12) may then be decoupled from each other and be transported by the mobile assembly unit 22 to storage space 20'. If not already done prior to transport, the inoperable solar panel units may be automatically decoupled from each other and thereby disassembled into the respective solar panel units 14 via the assembly 24 of the mobile assembly unit at storage space 20'. Then, the solar panel units 14 may be stowed in storage space 20', e.g. for later repair or disposal.

Basically, the assembly of the additional energy supplying device as well as its transport to satellite 16 is carried out in the same manner as the assembly and transport of energy supplying device 12 described above. The same applies for the assembly and the transport of the replacing energy supplying device.

To allow for proper functioning and reliability of each of the plurality of solar cells 14 as well as the energy supplying system 12 in space, at least some or all of the internal components of each of the plurality of solar cells 14 (such as wires, electrodes) may be provided more than one time (e.g. twice). The same applies to coupling member 26 and to the plurality of first coupling members for coupling the plurality of solar panel units 14 with each other. Further, a specific cell layout of each of the plurality of solar cells 14 provides for counteraction to induced micro fluxes.

The modular and scalable configuration of the energy supplying device 12 of the present disclosure allows for energy supplying solutions to be tailored (and thus optimized) to respective missions of different types of spacecrafts. Further, design of such energy supplying solutions is simplified.

Modularity of the energy supplying device 12 further provides the possibility to react to damages occurring in parts of the energy supplying device (like the solar panel units) as well as to react to mission changes of the respective spacecraft by replacing/adding/removing one or more of the solar panel units. Since the solar panel units are launched independently from an energy consuming spacecraft, consideration of the energy supplying device in the time consuming and complex tailoring process for the respective spacecraft is rendered obsolete.

Due to the possibility of automatic assembly of the energy supplying device 12 in space, acoustic noise loads resulting from thrusters of rocket 18 as well as from mechanical vibrations of rocket 18 that are possibly transferred to energy supplying device 12 via satellite 16 and/or hold-down systems of satellite 16 are avoided. That is, since such vibrations and noise loads primarily occur during launch, they naturally affect energy supplying devices 12 that are preassembled and coupled to satellite 16 on earth prior to launch, whereas energy supplying devices 12 automatically assembled in space are not exposed to such vibrations and noise loads.

The subject matter disclosed herein can be implemented in software in combination with hardware and/or firmware. For example, the subject matter described herein can be implemented in software executed by a processor or processing unit. In one exemplary implementation, the subject matter described herein can be implemented using a computer readable medium having stored thereon computer executable instructions that when executed by a processor of a computer control the computer to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An energy supplying device for supplying energy to an energy consuming device, the energy supplying device being operable in space and comprising:
   a plurality of solar panel units to convert received light into electrical energy;
   a plurality of first coupling members to couple the plurality of solar panel units with each other; and
   a second coupling member to electrically couple the energy supplying device with the energy consuming device,
   wherein the energy supplying device is configured to supply electrical energy to the energy consuming device in space,
   wherein a configuration of the plurality of solar panel units is changeable in space according to an operational requirement of the energy consuming device;
   wherein the configuration of the plurality of solar panel units is changeable by at least one of adding an additional solar panel unit to the plurality of solar panel units, removing a solar panel unit from the plurality of solar panel units, and replacing a solar panel unit in the plurality of solar panel units; and
   either of:
      wherein the energy supplying device is configured to determine the operational requirement as an increase in estimated power consumption of the energy consuming device, wherein the additional solar panel unit is added to the plurality of solar panel units according to the increase in estimated power consumption; or
      wherein the energy supplying device is configured to determine the operational requirement as a reduction in estimated power consumption of the energy consuming device, wherein the solar panel unit is removed from the plurality of solar panel units according to the reduction in estimated power consumption.

2. The energy supplying device of claim 1, wherein the energy supplying device is configured to determine a malfunctioning solar panel unit among the plurality of solar panel units, wherein the malfunctioning solar panel unit is replaced by a replacement solar panel unit.

3. The energy supplying device of claim 1, wherein the plurality of solar panel units have identical configurations with respect to at least one of power rating, size and internal wiring.

4. The energy supplying device of claim 1, wherein the plurality of solar panel units have different configurations with respect to at least one of power rating, size and internal wiring.

5. The energy supplying device of claim 1, wherein the second coupling member is configured to wirelessly couple the energy supplying device with the energy consuming device.

6. The energy supplying device of claim 1, wherein the second coupling member is configured to couple the energy supplying device with the energy consuming device in a wired manner, wherein the second coupling member is further configured to mechanically couple the energy supplying device with the energy consuming device.

7. A system comprising:
an energy supplying device for supplying energy to an energy consuming device, the energy supplying device being operable in space and comprising:
a plurality of solar panel units to convert received light into electrical energy;
a plurality of first coupling members to couple the plurality of solar panel units with each other; and
a second coupling member to electrically couple the energy supplying device with the energy consuming device,
wherein the energy supplying device is configured to supply electrical energy to the energy consuming device in space, and
wherein a configuration of the plurality of solar panel units is changeable in space according to an operational requirement of the energy consuming device;
an energy consuming device being operable in space; and
a mobile assembly unit residing in space and being configured to:
automatically assemble the energy supplying device in space from the plurality of solar panel units by coupling the plurality of solar panel units with each other via the plurality of first coupling members;
electrically couple the energy supplying device to the energy consuming device via the second coupling member; and
change the configuration of the plurality of solar panel units according to the operational requirement of the energy consuming device.

8. The system of claim 7, wherein the mobile assembly unit is further configured to transport the plurality of solar panel units or the assembled energy supplying device into a vicinity of the energy consuming device.

9. The system of claim 7, further comprising a spacecraft for launching the plurality of solar panel units into space, the spacecraft serving as an in-space repository for the plurality of solar panel units after launch.

10. The system of claim 7, wherein the configuration of the plurality of solar panel units is quality checked by the mobile assembly unit after the configuration of the plurality of solar panel units is changed.

11. The system of claim 7, wherein the energy supplying device is further configured to communicate with the mobile assembly unit to request the change in configuration of the plurality of solar panel units.

12. A method for supplying energy from an energy supplying device to an energy consuming device, wherein the energy supplying device is operable in space and comprises a plurality of solar panel units configured to convert received light into electrical energy, the method comprising:
coupling the plurality of solar panel units with each other via a plurality of first coupling members;
electrically coupling the energy supplying device with the energy consuming device in space via a second coupling member;
supplying electrical energy from the energy supplying device to the energy consuming device; and
changing a configuration of the plurality of solar panel units in space according to an operational requirement of the energy consuming device.

* * * * *